United States Patent
Jung et al.

(10) Patent No.: US 11,101,328 B2
(45) Date of Patent: Aug. 24, 2021

(54) VAPOR DEPOSITION APPARATUS, DEPOSITION METHOD, AND METHOD OF MANUFACTURING ORGANIC LIGHT-EMITTING DISPLAY APPARATUS BY USING THE SAME

(71) Applicant: SAMSUNG DISPLAY CO., LTD., Yongin (KR)

(72) Inventors: Suk-Won Jung, Yongin (KR); Myung-Soo Huh, Yongin (KR); Choel-Min Jang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 424 days.

(21) Appl. No.: 15/076,488

(22) Filed: Mar. 21, 2016

(65) Prior Publication Data

US 2016/0203954 A1    Jul. 14, 2016

Related U.S. Application Data

(62) Division of application No. 13/944,847, filed on Jul. 17, 2013, now Pat. No. 9,318,535.

(30) Foreign Application Priority Data

Feb. 18, 2013 (KR) .................... 2010-2013-0016977

(51) Int. Cl.
*H01J 37/32*    (2006.01)
*C23C 16/50*    (2006.01)
(Continued)

(52) U.S. Cl.
CPC .......... *H01L 27/32* (2013.01); *C23C 16/4401* (2013.01); *C23C 16/452* (2013.01);
(Continued)

(58) Field of Classification Search
None
See application file for complete search history.

(56) References Cited

U.S. PATENT DOCUMENTS

| 4,566,403 A | 1/1986 | Fournier |
| 5,458,856 A * | 10/1995 | Marie ..................... B29C 59/12 |
| | | 422/186 |

(Continued)

FOREIGN PATENT DOCUMENTS

| JP | 2006-299361 A | 11/2006 |
| JP | 2011-96616 A | 5/2011 |

(Continued)

OTHER PUBLICATIONS

EPO Search Report dated Jun. 18, 2014, for corresponding European Patent Application No. 13187439.8, 7 pages.

*Primary Examiner* — Karla A Moore
(74) *Attorney, Agent, or Firm* — Lewis Roca Rothgerber Christie LLP

(57) ABSTRACT

Provided is a vapor deposition apparatus including: a plasma generator configured to change at least a portion of a first raw material gas into a radical form; a corresponding surface corresponding to the plasma generator; a reaction space between the plasma generator and the corresponding surface; and an insulating member separated from, and surrounding the plasma generator.

22 Claims, 7 Drawing Sheets

(51) Int. Cl.
  *H05H 1/24* (2006.01)
  *C23C 16/509* (2006.01)
  *C23C 16/54* (2006.01)
  *H01L 27/32* (2006.01)
  *C23C 16/44* (2006.01)
  *C23C 16/452* (2006.01)
  *C23C 16/455* (2006.01)
  *H01L 51/56* (2006.01)

(52) U.S. Cl.
  CPC .. *C23C 16/45542* (2013.01); *C23C 16/45551* (2013.01); *C23C 16/50* (2013.01); *C23C 16/509* (2013.01); *C23C 16/54* (2013.01); *H01J 37/3244* (2013.01); *H01J 37/3255* (2013.01); *H01J 37/32357* (2013.01); *H01J 37/32467* (2013.01); *H01J 37/32513* (2013.01); *H01J 37/32541* (2013.01); *H01J 37/32559* (2013.01); *H01J 37/32834* (2013.01); *H05H 1/2406* (2013.01); *H01L 51/56* (2013.01); *H05H 2001/2418* (2013.01); *H05H 2001/2431* (2013.01)

(56) References Cited

U.S. PATENT DOCUMENTS

| | | | |
|---|---|---|---|
| 5,722,581 A * | 3/1998 | Sindzingre | B23K 1/20 228/206 |
| 6,083,355 A * | 7/2000 | Spence | B29C 59/14 204/164 |
| 6,106,659 A * | 8/2000 | Spence | B29C 59/14 118/723 E |
| 6,186,090 B1 | 2/2001 | Dotter, II et al. | |
| 6,429,400 B1 * | 8/2002 | Sawada | H01J 37/32366 219/121.52 |
| 6,441,553 B1 | 8/2002 | Yializis et al. | |
| 6,685,803 B2 * | 2/2004 | Lazarovich | B01D 53/326 204/164 |
| 6,764,658 B2 | 7/2004 | Denes et al. | |
| 8,039,772 B2 * | 10/2011 | Lee | H01J 37/32229 118/723 MW |
| 2003/0164143 A1 | 9/2003 | Toyoda et al. | |
| 2003/0228416 A1 | 12/2003 | Iwamaru | |
| 2005/0001527 A1 | 1/2005 | Sugiyama | |
| 2005/0016457 A1 | 1/2005 | Kawasaki et al. | |
| 2005/0104516 A1 | 5/2005 | Park et al. | |
| 2005/0158480 A1 | 7/2005 | Goodwin et al. | |
| 2005/0178330 A1 | 8/2005 | Goodwin et al. | |
| 2005/0179379 A1 | 8/2005 | Kim | |
| 2008/0286980 A1 | 11/2008 | Ishimaru | |
| 2009/0130858 A1 | 5/2009 | Levy | |
| 2010/0041213 A1 | 2/2010 | Lee | |
| 2010/0068413 A1 | 3/2010 | Lee | |
| 2011/0005681 A1 | 1/2011 | Savas et al. | |
| 2011/0212625 A1 | 9/2011 | Toyoda et al. | |
| 2011/0287193 A1 | 11/2011 | Creyghton et al. | |
| 2012/0119239 A1 | 5/2012 | Kim et al. | |
| 2012/0255492 A1 | 10/2012 | Wu et al. | |
| 2014/0174359 A1 | 6/2014 | Tabata et al. | |
| 2014/0174360 A1 * | 6/2014 | Huh | C23C 16/452 118/723 R |
| 2016/0099130 A1 * | 4/2016 | Ando | H01J 37/32522 315/111.21 |

FOREIGN PATENT DOCUMENTS

| | | |
|---|---|---|
| JP | 2011096616 A * | 10/2011 |
| KR | 10-2009-0125471 A | 12/2009 |
| KR | 10-2010-0020920 A | 2/2010 |
| KR | 10-2010-0032315 A | 3/2010 |
| WO | WO 2013/035375 A1 | 3/2013 |

* cited by examiner

FIG. 1
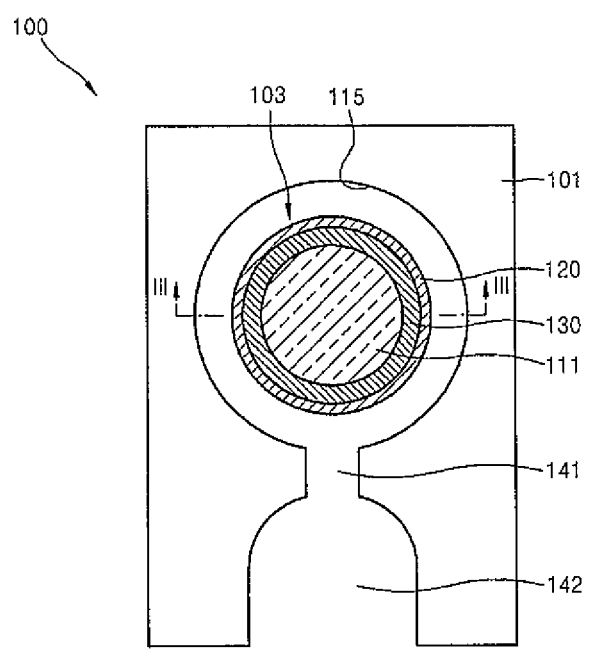
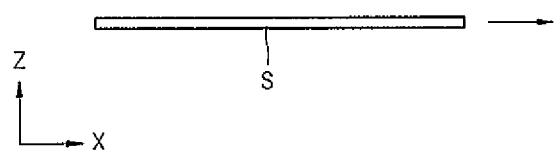

VAPOR DEPOSITION APPARATUS, DEPOSITION METHOD, AND METHOD OF MANUFACTURING ORGANIC LIGHT-EMITTING DISPLAY APPARATUS BY USING THE SAME

CROSS-REFERENCE TO RELATED PATENT APPLICATION

This divisional patent application claims priority to and the benefit of U.S. application Ser. No. 13/944,847, filed on Jul. 17, 2013, which claims priority to and the benefit of Korean Patent Application No. 10-2013-0016977, filed on Feb. 18, 2013, in the Korean Intellectual Property Office, the disclosure of which is incorporated herein in its entirety by reference.

BACKGROUND

1. Field

Embodiments of the present invention relate to a vapor deposition apparatus and a method of manufacturing an organic light-emitting display apparatus.

2. Description of the Related Art

A semiconductor device, a display apparatus, and other electronic devices include a plurality of thin films. There are various methods of forming such a plurality of thin films. One of such various methods is a vapor deposition method.

The vapor deposition method employs one or more gases as a raw material for forming a thin film. The vapor deposition method includes various methods such as chemical vapor deposition (CVD) or atomic layer deposition (ALD).

With regard to the ALD method, one raw material is injected and purged/pumped. Then, a single molecular layer or a multiple molecular layer is adsorbed onto a substrate. Then, another raw material is injected and purged/pumped. Thus, a desired single atomic layer is formed or multiple atomic layers are formed.

An organic light-emitting display apparatus, as compared to other types of display apparatuses, provides a rapid response, as well as a wide view angle and an excellent contrast. Thus, the organic light-emitting display apparatus is drawing attention as a next-generation display apparatus.

The organic light-emitting display apparatus includes an intermediate layer having an organic light-emitting layer between a first electrode and a second electrode which face each other, and further includes one or more various thin films. A deposition process may be used in order to form the one or more thin films in the organic light-emitting display apparatus.

However, as the size of the organic light-emitting display apparatus increases, it becomes more difficult to deposit large-sized thin films while maintaining desired characteristics such as high resolution. Additionally, there is a limit on improving an efficiency of a process of forming such thin films.

SUMMARY

One or more embodiments of the present invention provide a vapor deposition apparatus for efficiently preventing or substantially preventing contamination of a deposition space and improving characteristics of a deposition layer, a deposition method, and a method of manufacturing an organic light-emitting display apparatus.

According to an aspect of the present invention, there is provided a vapor deposition apparatus for forming a deposition layer on a substrate, the vapor deposition apparatus including: a plasma generator configured to change at least a portion of a first raw material gas into a radical form; a corresponding surface corresponding to the plasma generator; a reaction space between the plasma generator and the corresponding surface; and an insulating member separated from, and surrounding the plasma generator.

The insulating member may be separated from the plasma generator by an inserting member located between the plasma generator and the insulating member.

A space between the plasma generator and the insulating member may be substantially sealed by the inserting member.

The inserting member may include a first inserting member adjacent one end of the plasma generator, and a second inserting member adjacent an opposing end of the plasma generator, and wherein a space between the first inserting member and the second inserting member, between the plasma generator and the insulating member, may be substantially sealed by the first inserting member and the second inserting member.

The inserting member may have elasticity.

The inserting member may be an O-ring.

The plasma generator may be an electrode.

The plasma generator may have a generally column shape.

The insulating member may be a hollow column.

The insulating member may include a quartz or ceramic material.

The insulating member may surround an entire external surface of the plasma generator.

A first injector may be coupled to the reaction space and configured to inject a deposition raw material onto the substrate, the deposition raw material including a radical form of the first raw material gas.

A connection unit may be between the reaction space and the first injector, the connection unit having a narrower width than the first injector.

A second injector may be adjacent the first injector, the second injector being separated from the first injector.

The second injector may be configured to inject a second raw material or a purge gas toward a direction of the substrate for forming the deposition layer.

A second injector and a third injector may be adjacent to and separated from the first injector, and respectively on opposing sides of the first injector.

The second injector and the third injector may be respectively configured to inject one selected from the group consisting of a purge gas, a second raw material, and a third raw material, in a direction toward the substrate.

A plurality of exhausts may be adjacent to each of the first injector, the second injector, and the third injector.

The plurality of exhausts may include a first exhaust between the first injector and the second injector, and a second exhaust between the first injector and the third injector.

The substrate and the vapor deposition apparatus may be configured to move with respect to each other.

According to another embodiment of the present invention, there is provided a vapor deposition apparatus for forming a deposition layer on a substrate, the vapor deposition apparatus including: a plurality of first regions, a plurality of second regions, and a plurality of purge units, wherein each of the plurality of first regions includes: a plasma generator configured to change at least a portion of a first raw material gas into a radical form; a surface corresponding to the plasma generator; a reaction space between the plasma generator and the corresponding surface; and an insulating member separated from, and surrounding the plasma generator; wherein each of the plurality of second regions is configured to inject a second raw material in a direction toward the substrate; and wherein the purge units are configured to inject a purge gas in a direction toward the substrate.

Each purge unit, among the plurality of purge units, may be between the first region and the second region.

A plurality of exhaust units may be adjacent the first regions, the second regions, and the purge units.

According to another aspect of the present invention, there is provided a method of forming a deposition layer on a substrate, the method including: supplying a first raw material gas from a supply unit to a reaction space; changing at least a portion of the first raw material gas into a radical form, by generating a plasma using a plasma generator in the reaction space; and injecting a first raw depositing material onto the substrate, the first raw depositing material including a radical form, wherein the changing of at least a portion of the first raw material gas into a radical form includes substantially preventing electrons or ions, which are generated when the plasma is generated, from accelerating and colliding with the plasma generator using an insulating member separate from and surrounding the plasma generator.

The substrate and the vapor deposition apparatus may be configured to move with respect to each other and execute a deposition process.

According to another aspect of the present invention, there is provided a method of manufacturing an organic light-emitting display apparatus by using a vapor deposition apparatus, wherein the organic light-emitting display apparatus includes a first electrode, an intermediate layer which includes an organic light-emitting layer, a second electrode, and an encapsulation layer, wherein forming at least one thin film of the organic light-emitting display apparatus includes: positioning a substrate to correspond to the vapor deposition apparatus; supplying a first raw material gas from a supply unit of the vapor deposition apparatus to a reaction space; changing at least a portion of the first raw material gas into a radical form, by generating a plasma using a plasma generator in the reaction space; and injecting a first raw depositing material into the substrate, the first raw depositing material including a radical form, wherein the changing at least a portion of the first raw material gas into a radical form includes substantially preventing electrons or ions, which are generated when the plasma is generated, from accelerating and colliding with the plasma generator using an insulating member separated from and surrounding the plasma generator.

The forming of the thin film of the organic light-emitting display may include forming the encapsulation layer on the second electrode.

The forming of the thin film of the organic light-emitting display may include forming an insulating layer.

The forming of the thin film of the organic light-emitting display may include forming a conductive layer.

BRIEF DESCRIPTION OF THE DRAWINGS

The above and other features and aspects of the present invention will become more apparent by describing in detail exemplary embodiments thereof with reference to the attached drawings in which:

FIG. 1 is a schematic diagram illustrating a vapor deposition apparatus, according to an embodiment of the present invention;

DETAILED DESCRIPTION

Hereinafter, the present invention will be described in detail by explaining embodiments of the invention with reference to the attached drawings.

Figure 2:
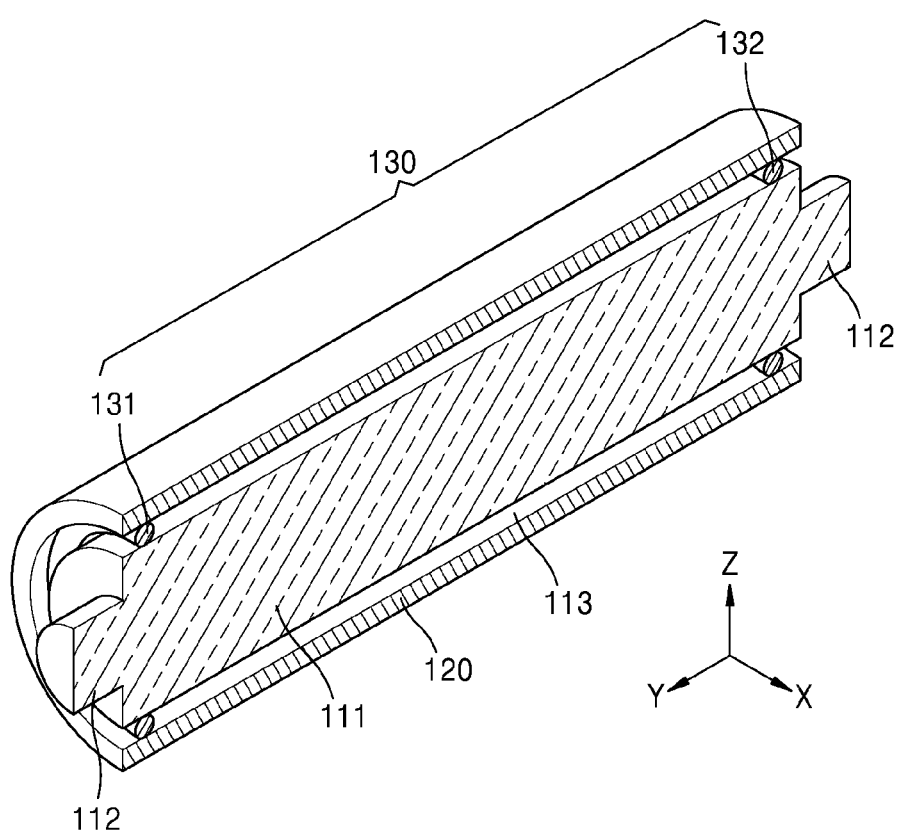
FIG. 2 is an exploded oblique view illustrating a plasma generation unit and an insulating member of FIG. 1.
Figure 3:
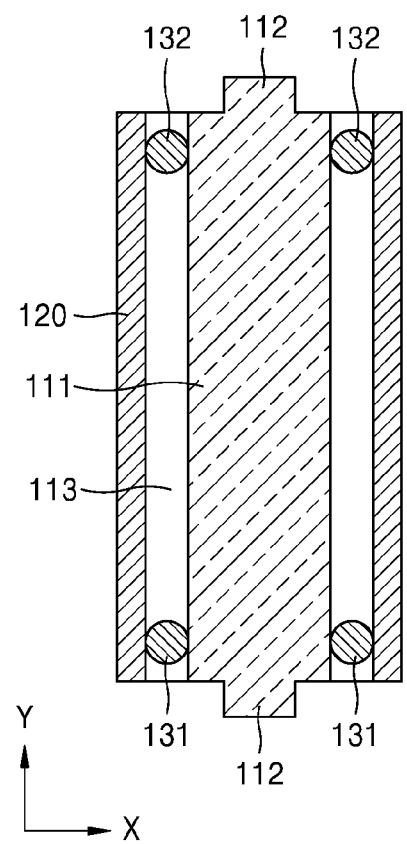
FIG. 3 is a cross-sectional view of the vapor deposition apparatus taken along the line III-III of FIG. 1.

FIG. 1 is a schematic diagram illustrating a vapor deposition apparatus, according to an embodiment of the present invention. FIG. 2 is an exploded oblique view illustrating a plasma generation unit and an insulating member of FIG. 1. FIG. 3 is a cross-sectional view of the vapor deposition apparatus taken along the line III-III of FIG. 1

Referring to FIGS. 1 through 3, the vapor deposition apparatus 100 includes a housing 101, a supply unit (not illustrated), a plasma generation unit (or plasma generator) 111, a corresponding surface 115, a reaction space 103, an insulating member 120, and an injection unit (or injector) 142.

The housing 101 is formed of a durable material so as to maintain the entire shape and appearance of the vapor deposition apparatus 100. The housing 101 may be formed in a shape similar to a rectangular parallelepiped. However, this is only an example, and the housing 101 may be formed in various shapes.

The supply unit (not illustrated) is coupled to the housing 101. For example, the supply unit may be formed on an upper surface of the housing 101, and may have a shape of a through hole so that one or more raw material gases may be supplied. The number of the supply unit (not illustrated) may be determined variously according to a size of a deposition target on which a deposition process is to be performed.

The plasma generation unit 111 is located inside the housing 101. The plasma generation unit 111 may be an electrode to which a voltage is applied. Additionally, a terminal unit 112, which has a protruding shape, may be formed at both sides of the plasma generation unit 111, as illustrated in FIGS. 2 and 3. However, the present invention is not limited thereto, and the terminal unit 112 may not be provided.

The plasma generation unit 111 may have a form of a column. Alternatively, the plasma generation unit 111 may have a form such as a cylinder.

The corresponding surface 115 is a surface which corresponds to the plasma generation unit 111. Additionally, the corresponding surface 115 may be an electrode which corresponds to the plasma generation unit 111. For example, the corresponding surface 115 may be a ground electrode.

Thus, a plasma is generated from a space between the plasma generation unit 111 and the corresponding surface 115 that is the reaction space 103. The reaction space 103 will be described later. A raw material gas, which flows through the supply unit (not illustrated), is changed into a radical form in the reaction space 103 between the plasma generation unit 111 and the corresponding surface 115. Thus, deposition characteristics of the raw material gas are improved.

The reaction space 103 is defined as a space (e.g., a predetermined space) inside the housing 101. Specifically, the reaction space 103 is a space between the plasma generation unit 111 and the corresponding surface 115. The reaction space 103 may be coupled to the supply unit (not illustrated) which is described above. Thus, a raw material gas may be changed into a radical form in the reaction space 103.

The insulating member 120 surrounds the plasma generation unit 111. That is, the insulating member 120 is located in the reaction space 103, to separate the plasma generation unit 111 from the corresponding surface 115. Additionally, the insulating member 120 may have a form or shape of a hollow column to surround the plasma generation unit 111. For example, the insulating member 120 may have a form of a hollow cylinder to correspond to the plasma generation unit 111. The insulating member 120 is formed of a quartz or ceramic material. For example, the insulating member 120 may contain an aluminum oxide such as alumina ($Al_2O_3$).

Additionally, the insulating member 120 may correspond to or surround (e.g., cover) an entire external surface around the circumference or periphery of the plasma generation unit 111. That is, a length of the insulating member 120 may correspond to or be greater than a length of the plasma generation unit 111.

The insulating member 120 surrounds, but does not contact, the plasma generation unit 111. To achieve this, an inserting member 130 is positioned between the insulating member 120 and the plasma generation unit 111.

The inserting member 130 is formed of an elastic material. The inserting member 130 may be an O-ring. The inserting member 130 includes a first inserting member 131 and a second inserting member 132. The first inserting member 131 is adjacent to one end of the plasma generation unit 111, and the second inserting member 132 is adjacent to another end of the plasma generation unit 111. Thus, an enclosed space 113 is formed between the plasma member 111 and the insulating member 120.

The injection unit 142 is formed to be coupled to the reaction space 103. The raw material gas, which flows from the supply unit (not illustrated), is changed into a radical form in the reaction space 103, and transmitted to the injection unit 142. Then, the raw material gas reacts with a deposition target at the injection unit 142, and thus, a deposition process is performed on a surface of the deposition target. The injection unit 142 is coupled to the reaction space 103 by using a connection unit or connector 141. The connection unit 141 may have a narrower width than the injection unit 142 and the reaction space 143.

Thus, the raw material gas is induced to remain for a sufficiently long time in the reaction space 103, so that an amount of the raw material gas, changed into a radical form, may increase. Thus, the raw material of deposition may be effectively transmitted to the injection unit 142.

A method of deposition, by using the vapor deposition apparatus 100 in the current embodiment, is briefly described.

When a substrate S, which is a deposition target, corresponds to (e.g., is positioned within a suitable distance relative to) the injection unit 142 of the vapor deposition apparatus 100, a deposition process may be performed on the substrate S. Then, the substrate S and the vapor deposition apparatus 100 may move with respect to each other, and to perform the deposition process. That is, the substrate S may move in an X direction shown in FIG. 1, and a deposition process is consecutively performed. Conversely, the vapor deposition apparatus 100 may move and a deposition process is performed. Additionally, the present invention is not limited thereto, and the substrate S may be fixed to the vapor deposition apparatus 100, and a deposition process is performed.

First, through the supply unit (not illustrated), one or more raw material gases flows into the reaction space 103. Then, a plasma is generated from or within the reaction space 103 between the plasma generation unit 111 and the corresponding surface 115. At least a portion of the raw material gases, which flows into the reaction space 103, is changed into a radical form. The raw material in the radical form reaches the substrate S, and thus, a deposition layer which includes the raw material is formed.

Ions and electrons, generated when the plasma is generated, may accelerate and collide with the plasma generation unit 111. In such a case, particles may be generated from a surface of the plasma generation unit 111, and thus, the plasma generation unit 111 may be damaged. Additionally, such particles may contaminate a deposition layer. However, in the current embodiment, the insulating member 120 surrounds the plasma generation unit 111, so as to prevent the accelerating ions and electrons from colliding with the surface of the plasma generation unit 111, and thus, prevent generation of particles. For example, the inserting member, such as an O-ring, is located between the insulating member 120 and the plasma generation unit 111, so as to enclose a space between the insulating member 120 and the plasma generation unit 111. Thus, accelerating ions and electrons may be completely prevented from colliding with the plasma generation unit 111.

Additionally, the plasma generation unit 111 and the insulating member 120 are separated from each other, so that generation of additional particles from the insulating member 120 is prevented or substantially prevented. That is, if the plasma generation unit 111 and the insulating member 120 contact each other, heat generated from the plasma generation unit 111 may increase phonon in the insulating member 120, and thus, high heat is generated on the insulating member 120. Additionally, such high heat may cause particles from a surface of the insulating member 120 to be generated. However, in the current embodiment, the plasma generation unit 111 and the insulating member 120 are separated from each other, and thus, transmission of the heat, generated from the plasma generation unit 111, to the insulating member 120 is effectively prevented or substantially prevented. Therefore, generation of additional particles may be effectively prevented or substantially prevented.

As such, the vapor deposition apparatus 100, in the current embodiment, may relatively easily form a high-purity deposition layer by keeping inside of the reaction space 103 uncontaminated or substantially uncontaminated.

Figure 4:
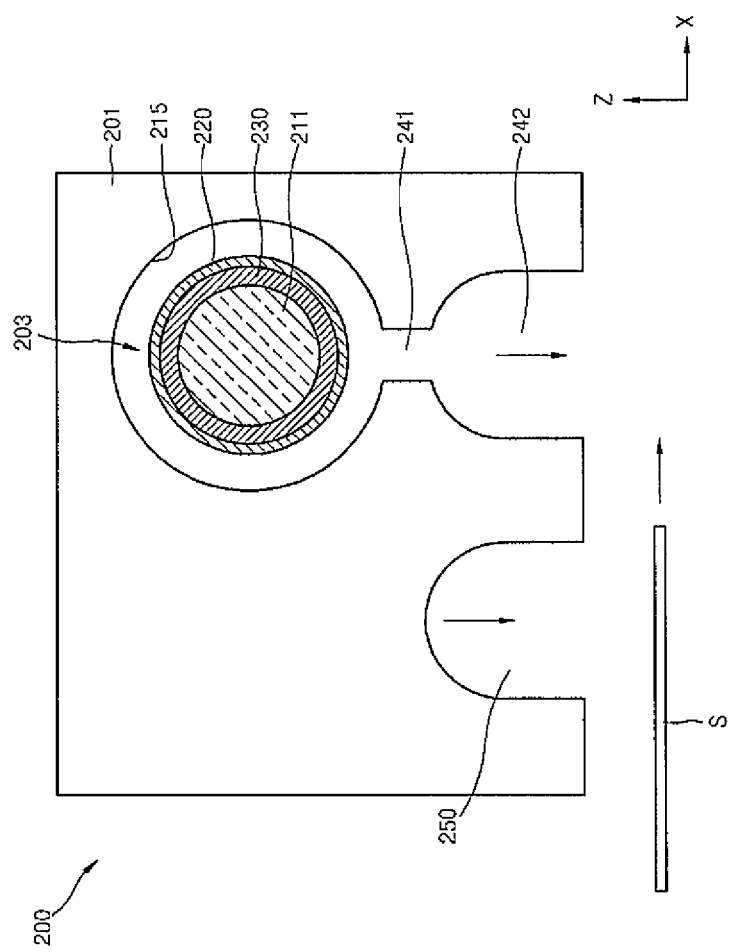
FIG. 4 is a schematic plan view illustrating a vapor deposition apparatus, according to another embodiment of the present invention.

FIG. 4 is a schematic plan view illustrating a vapor deposition apparatus, according to another embodiment of the present invention.

Referring to FIG. 4, a vapor deposition apparatus 200 includes a housing 201, a supply unit (not illustrated), a plasma generation unit (or plasma generator) 211, a corresponding surface 215, a reaction space 203, an insulating member 220, a first injection unit (or first injector) 242, and a second injection unit (or second injector) 250.

The housing 201 is formed of a durable material so as to maintain an entire shape and appearance of the vapor deposition apparatus 200. The housing 201 may be formed in a shape similar to a rectangular parallelepiped. However, this is only an example, and the housing 201 may be formed in various shapes.

The supply unit (not illustrated) is located on an upper portion of the housing 201. The supply unit has a shape of a through hole, so as to supply a first raw material gas into the reaction space 203, and a second raw material gas into the second injection unit 250. The number of supply units (not illustrated) may be determined variously according to a size of a deposition target on which a deposition process is to be executed.

The plasma generation unit 211 is located inside the housing 201. The plasma generation unit 211 may have be an electrode to which a voltage is applied. The reaction space 203 is defined as a space (e.g., a predetermined space) inside the housing 201. Specifically, the reaction space 203 is a space between the corresponding surface 215 and the plasma generation unit 211. An insulating member 220 surrounds the plasma generation unit 211, but does not contact the plasma generation unit 211. To achieve this, an inserting member 230 is located between the insulating member 220 and the plasma generation unit 211. The inserting member 230 is formed of an elastic material. For example, the inserting member 230 may be an O-ring. Similar to the embodiment shown in FIGS. 1-3, the inserting member 230 may include a first inserting member and a second inserting member. Configurations of the plasma generation unit 211, the insulating member 220, and the inserting member 230 are substantially the same as or substantially similar to those of the plasma generation unit, the insulating member, and the inserting member in the previous embodiment described above. Thus, their repeated description is not provided here.

The first injection unit 242 is formed to be coupled to the reaction space 203. A first raw material gas, which flows from the supply unit (not illustrated), is changed into a radical form in the reaction space 203, and transmitted to the first injection unit 242. Then, the first raw material gas reacts with a deposition target at the first injection unit 242, and thus, a deposition process is performed on a surface of the deposition target. The first injection unit 242 is coupled to the reaction space 203 by using a connection unit or connector 241. The connection unit 241 may have a narrower width than the injection unit 242 and the reaction space 203.

The second injection unit 250 is formed to be adjacent to the reaction space 242. Additionally, the second injection unit 250 may be separated from the first injection unit 242. The second injection unit 250 injects a second raw material, to be deposited on the substrate S, in a direction toward the substrate S. Though not illustrated, the second injection unit 250 is coupled to the supply unit (not illustrated) so as to be supplied with the second raw material. The second injection unit 250 may be formed separately from the supply unit (not illustrated) for supplying the first raw material that flows into the reaction space 203.

A deposition method of using the vapor deposition apparatus 200, in the current embodiment, is briefly described.

When the substrate S, which is a deposition target, corresponds to the second injection unit 250 of the vapor deposition apparatus 200, the second injection unit 250 injects a second raw material, for example, a second raw material in a gas state in a direction toward the substrate S.

Then, when the substrate S, which is a deposition target, moves along an X direction shown in FIG. 4, that is, a direction of an arrow, and thus, corresponds to the first injection unit 242, a first raw material gas flows into the reaction space 203. Then, the substrate S and the vapor deposition apparatus 200 may relatively move with respect to each other, and a deposition process may be performed. That is, the substrate S may move in an X direction as shown in FIG. 4, and then, a deposition process may be consecutively executed. Conversely, the vapor deposition apparatus 200 may move, and a deposition process may be performed. Additionally, the present invention is not limited thereto, and the substrate S may be fixed to the vapor deposition apparatus 200, and a deposition process may be executed.

Through the supply unit (not illustrated), a second raw material gas may flow into the reaction space 203. Then, a plasma is generated within the reaction space 203 between the plasma generation unit 211 and the corresponding surface 215. At least a portion of the raw material gases, which flows into the reaction space 203, is changed into a radical form. The raw material, changed into the radical form, reaches the substrate S via the first injection unit 242. Resultantly, a deposition layer, which contains the first raw material and the second raw material, is formed on the substrate S. For example, a single-layered deposition layer, which contains the first raw material and the second raw material, may be formed on the substrate S.

The insulating member 220 surrounds the plasma generation unit 211, and thus, generation of particles, which may be generated from a surface of the plasma generation unit 211, may be prevented. For example, the inserting member 230, such as an O-ring, is located between the insulating member 220 and the plasma generation unit 211, so as to enclose a space between the insulating member 220 and the plasma generation unit 211. Thus, ions and electrons, which are generated when a plasma is generated, may be completely prevented or substantially prevented from colliding with the plasma generation unit 211.

Additionally, the plasma generation unit 211 and the insulating member 220 are separated from each other, and thus, generation of additional particles may be prevented or substantially prevented. That is, if the plasma generation unit 211 and the insulating member 220 contact each other, heat generated from the plasma generation unit 211 may increase phonon in the insulating member 220, and thus, a relatively high heat may be generated from the insulating member 220. Additionally, such high heat may cause generation of particles from a surface of the insulating member 220. However, in the current embodiment, the plasma generation unit 211 and the insulating member 220 are separated from each other. Therefore, transmission of the heat, generated from the plasma generation unit 211, to the insulating member 220 may be effectively prevented, substantially prevented, or reduced.

As a result, the vapor deposition apparatus 200, in the current embodiment, may easily form a relatively high-purity deposition layer by keeping the inside of the reaction space 203 uncontaminated or substantially uncontaminated.

Figure 5:
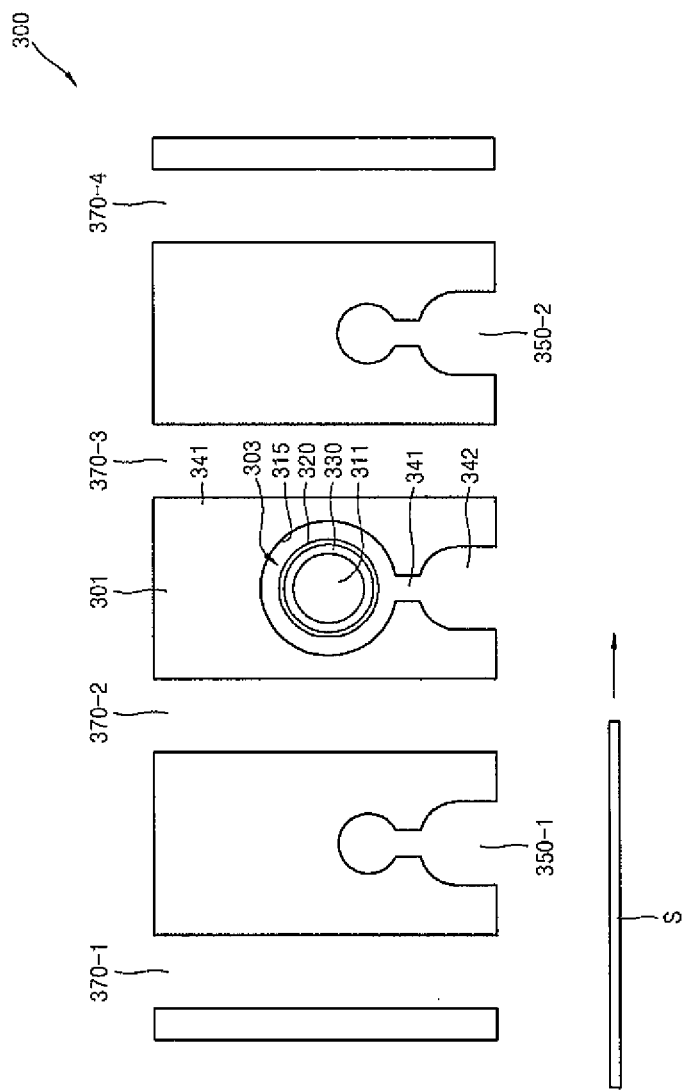
FIG. 5 is a schematic plan view illustrating a vapor deposition apparatus, according to another embodiment of the present invention.

FIG. 5 is a schematic plan view illustrating a vapor deposition apparatus 300, according to another embodiment of the present invention.

Referring to FIG. 5, the vapor deposition apparatus 300 includes a housing 301, a supply unit (not illustrated), a plasma generation unit (or plasma generator) 311, a reaction space 303, a corresponding surface 315, an insulating member 320, a first injection unit (or first injector) 342, a second injection unit (or second injector) 350-1, and a third injection unit (or third injector) 350-2. Additionally, the vapor deposition apparatus 300 further includes exhaust units (or exhausts) 370-1 through 370-4.

The housing 301 is formed of a durable material so as to maintain an entire shape and appearance of the vapor deposition apparatus 300.

The supply unit (not illustrated) is located in the housing 301. For example, the supply unit may be formed on an upper portion of the housing 301, and may include shapes of a plurality of through holes, so as to supply a first raw material gases into the reaction space 303, and supply a plurality of gases into the second injection unit 350-1 and the third injection unit 350-2.

The plasma generation unit 311 is located inside the housing 301. The plasma generation unit 311 may be an electrode to which a voltage is applied. The corresponding surface 315 is a surface which corresponds to the plasma generation unit 311. The reaction space 303 is defined as a predetermined space inside the housing 301. Specifically, the reaction space 103 is a space between the corresponding surface 315 and the plasma generation unit 311. An insulating member 320 surrounds, but does not contact the plasma generation unit 311. To achieve this, an inserting member 330 is between the insulating member 320 and the plasma generation unit 311. The inserting member 330 is formed of an elastic material. The inserting member 330 may be an O-ring. Similar to the embodiment shown in FIGS. 1-3, the inserting member 330 may include a first inserting member and a second inserting member. Configurations of the plasma generation unit 311, the insulating member 320, and the inserting member 330 are substantially the same as or substantially similar to those of the plasma generation unit, the insulating member, and the inserting member in the previous embodiment described above. Thus, their repeated description is not provided here.

The first injection unit 342 is formed to be coupled to the reaction space 303. That is, the response space 303 is between the supply unit (not illustrated) and the first injection unit 342. A first raw material gas, which flows from the supply unit (not illustrated), is changed into a radical form in the reaction space 303, and then, transmitted to the first injection unit 242. Then, the first raw material gas reacts with a deposition target at the first injection unit 342, and thus, a deposition process is executed on a surface of the deposition target. The first injection unit 342 is coupled to the reaction space 303 by using a connection unit or connector 341. The connection unit 341 may have a narrower width than the injection unit 342 and the reaction space 303.

The second injection unit 350-1 is formed to be adjacent to the first injection unit 342. Additionally, the second injection unit 350-1 may be separated from the first injection unit 342. The second injection unit 350-1 injects a purge gas into the substrate S, in a direction toward the substrate S. The purge gas includes an inert gas. Additionally, the present invention is not limited thereto, and the second injection unit 350-1 may inject a second raw material, to be deposited on the substrate S, in a direction toward the substrate S. Though not illustrated, the second injection unit 350-1 is coupled to the supply unit (not illustrated) so as to be supplied with the purge gas or the second raw material. The second injection unit 350-1 may be formed to be separated from the supply unit (not illustrated) for supplying the first raw material that flows into the reaction space 203.

The third injection unit 350-2 is formed to be adjacent to the first injection unit 342. Additionally, the third injection unit 350-2 may be separated from the first injection unit 342. Specifically, the first injection unit 342 is between the second injection unit 350-1 and the third injection unit 350-2.

The third injection unit 350-2 injects a purge gas into the substrate S, in a direction toward the substrate S. The purge gas includes an inert gas. Additionally, the present invention is not limited thereto, and the third injection unit 350-2 may inject the second raw material, to be deposited on the substrate S, in a direction toward the substrate S. Additionally, the second injection unit 350-1 may inject a third raw material, to be deposited on the substrate S, in a direction toward the substrate S.

Additionally, the exhaust unit 370-2 is between the first injection unit 342 and the second injection unit 350-1. The exhaust unit 370-3 is between the first injection unit 342 and the third injection unit 350-2. Additionally, the exhaust unit 370-1 and the exhaust unit 370-4 are respectively adjacent to edges of the second injection unit 350-1 and the third injection unit 350-2.

The exhaust units 370-1 through 370-4 are adjacent to the first injection unit 342, the second injection unit 350-1, and the third injection unit 350-2. When a deposition process is performed via the first injection unit 342, the second injection unit 350-1, and the third injection unit 350-2, the exhaust units 370-1 through 370-4 may relatively easily exhaust a remaining material, and thus, characteristics of a deposition layer may be improved.

The substrate S and the vapor deposition apparatus 300 may move with respect to each other, and thus, a deposition process may be performed. That is, as illustrated in FIG. 5, the substrate S may move in an X direction, and thus, a deposition process may be consecutively performed. Conversely, the vapor deposition apparatus 300 may move, and thus, a deposition process may be performed. Additionally, the present invention is not limited thereto, and the substrate S may be fixed to the vapor deposition apparatus 100, and thus, a deposition process may be performed.

Additionally, in the current embodiment, the second and third injection units 350-1 and 350-2, for injecting a purge gas, are included. Thus, when a deposition process is performed via the first injection unit 342, a foreign object or an impure gas may be easily prevented or substantially prevented from flowing into an area of a deposition process, Additionally, the insulating member 320 surrounds the plasma generation unit 311, and thus, generation of particles, which may be generated from a surface of the plasma generation unit 311 due to acceleration of electrons, may be prevented or substantially prevented. For example, the inserting member 330, such as an O-ring, is located between the insulating member 320 and the plasma generation unit 311, so as to enclose a space between the insulating member 320 and the plasma generation unit 311. Thus, ions and electrons, which are generated when a plasma is generated, may be completely prevented or substantially prevented from colliding with the plasma generation unit 311.

Additionally, the plasma generation unit 311 and the insulating member 320 are separated from each other, so as to prevent generation of additional particles. That is, if the plasma generation unit 311 and the insulating member 320 contact each other, heat generated from the plasma generation unit 311 may increase phonon in the insulating member 320, and thus, a relatively high heat may be generated from the insulating member 320. Additionally, such high heat may cause generation of particles from a surface of the insulating member 320. However, in the current embodiment, the plasma generation unit 311 and the insulating member 320 are separated from each other. Thus, transmission of the heat, generated from the plasma generation unit 311, to the insulating member 320 is effectively prevented, substantially prevented, or reduced.

As a result, the vapor deposition apparatus 300, in the current embodiment, may relatively easily form a high-purity deposition layer by keeping the inside of the reaction space 303 uncontaminated or substantially uncontaminated.

Figure 6:
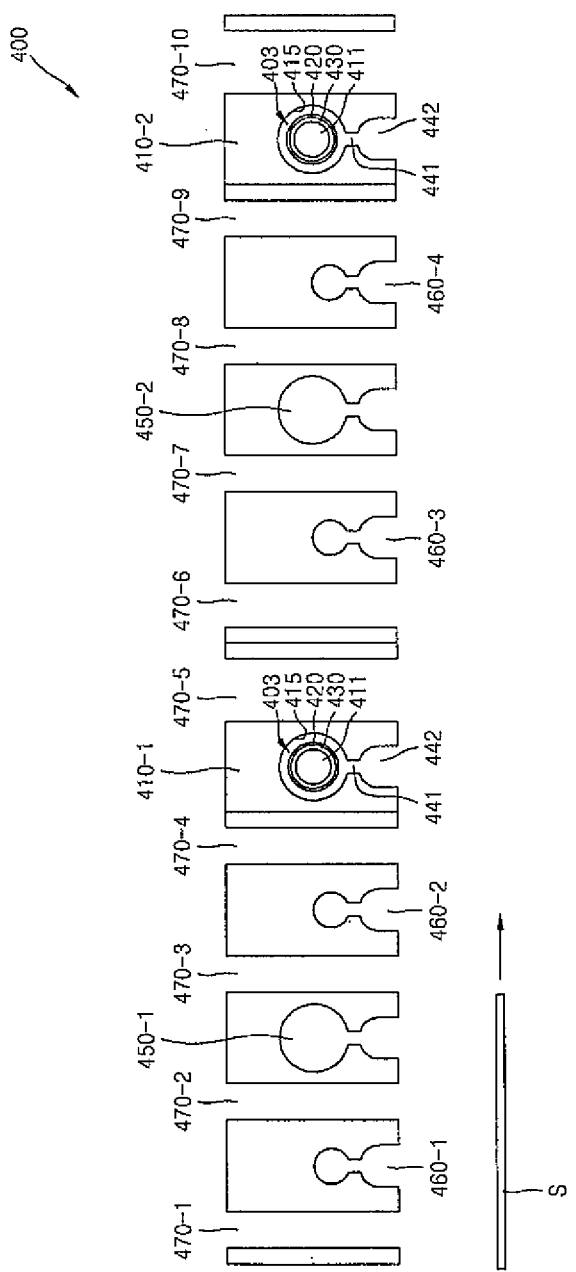
FIG. 6 is a schematic plan view illustrating a vapor deposition apparatus, according to another embodiment of the present invention.

FIG. 6 is a schematic plan view illustrating a vapor deposition apparatus, according to another embodiment of the present invention.

Referring to FIG. 6, the vapor deposition apparatus 400 includes a plurality of first regions 410-1 and 410-2, a plurality of second regions 450-1 and 450-2, a plurality of purge units 460-1 through 460-4, and a plurality of exhaust units (or exhausts) 470-1 through 470-10.

The first regions 410-1 and 410-2 respectively include a housing 401, a supply unit (not illustrated), a plasma generation unit (or plasma generator) 411, a reaction space 403, an insulating member 420, and a first injection unit (or first injector) 442.

The housing 401 may be formed of a durable material so as to maintain an entire shape and appearance of the vapor deposition apparatus 400, as well as those of the first region 410-1.

That is, the housing 401 may be formed to respectively correspond to the first regions 410-1 and 410-2. However, the housing 401 may be formed to correspond to the vapor deposition apparatus 400.

The first regions 410-1 and 410-2 have the same configuration. Thus, only the configuration of the first region 410-1 will be described here.

The supply unit (not illustrated) is located in the housing 401. For example, the supply unit may be located on an upper portion of the housing 401. The supply unit supplies a first raw material gas into the reaction space 403.

The plasma generation unit 411 is located inside the housing 401. The plasma generation unit 411 may be an electrode to which a voltage is applied. The corresponding surface 415 is a surface which corresponds to the plasma generation unit 411. The reaction space 403 is defined as a space (e.g., a predetermined space) inside the housing 401. Specifically, the reaction space 403 is a space between the corresponding surface 415 and the plasma generation unit 411. An insulating member 420 surrounds, but does not contact the plasma generation unit 411. To achieve this, an inserting member 430 is between the insulating member 420 and the plasma generation unit 411. The inserting member 430 is formed of an elastic material. The inserting member 430 may be an O-ring. Similar to the embodiment shown in FIGS. 1-3, the inserting member 430 includes a first inserting member and a second inserting member. Configurations of the plasma generation unit 411, the insulating member 420, and the inserting member 430 are substantially the same as or substantially similar to those of the plasma generation unit, the insulating member, and the inserting member in the previous embodiments described above. Thus, their repeated description is not provided here.

The first injection unit 442 is formed to be coupled to the reaction space 403. That is, the response space 403 is between the supply part (not illustrated) and the first injection unit 442. A first raw material gas, which flows via the supply unit (not illustrated), is changed into a radical form in the reaction space 403, and then, transmitted to the first injection unit 442. Then, the first raw material gas reacts with a deposition target at the first injection unit 442, and thus, a deposition process is performed on a surface of the deposition target. The first injection unit 442 is coupled to the reaction space 403 by using a connection unit 441. The connection unit 441 may have a narrower width than the injection unit 442 and the reaction space 403.

The plurality of second regions 450-1 and 450-2 are separated from the first regions 410-1 and 410-2. Additionally, the second regions 450-1 and 450-2 respectively inject a second raw material into the substrate S, to be deposited on the substrate S, in a direction toward the substrate S.

The plurality of purge units 460-1 through 460-4 are located adjacently with respect to the first regions 410-1 and 410-2 and the second regions 450-1 and 450-2.

Specifically, the purge unit 460-2 is located between the first region 410-1 and the second region 450-1, the purge unit 460-3 is located between the first region 410-1 and the second region 450-2, and the purge unit 460-4 is located between the first region 410-2 and the second region 450-2.

Additionally, the purge unit 460-1 are located adjacent to the second region 450-1. The plurality of purge units 460-1 through 460-4, which contain an inert gas, inject a purge gas in a direction of the substrate S.

Each of the plurality of exhaust units 470-1 through 470-10 are located respectively adjacent to the plurality of first regions 410-1 and 410-2, the plurality of second regions 450-1 and 450-2, and the plurality of purge units 460-1 through 460-4.

Figure 7:
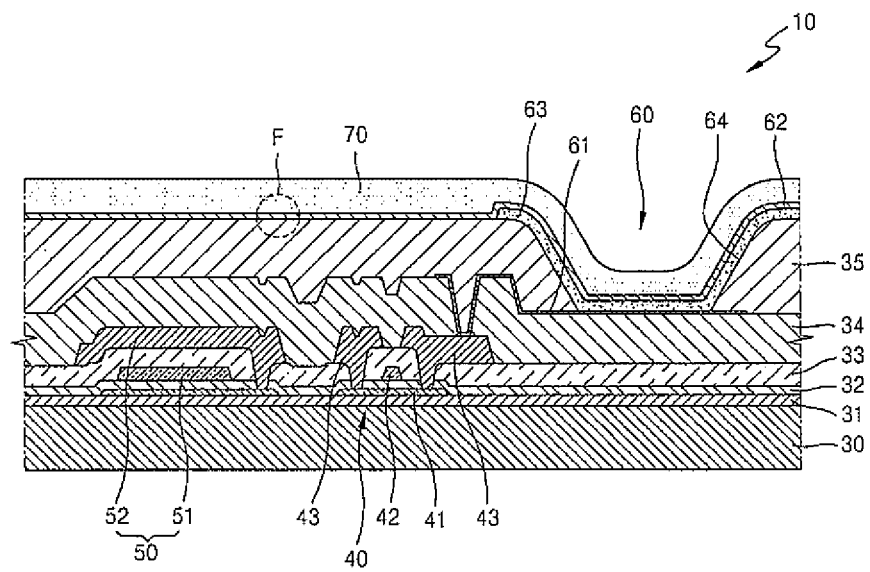
FIG. 7 is a schematic cross-sectional view illustrating an organic light-emitting display apparatus which is manufactured by using a method of manufacturing an organic light-emitting display apparatus, according to an embodiment of the present invention.

That is, the plurality of exhaust units 470-1 through 470-10 are respectively between the plurality of first regions 410-1 and 410-2, and the plurality of second regions 450-1 and 450-2. FIG. 7 illustrates the two exhaust units 470-5 and 470-6 which are located between the first region 410-1 and the purge unit 460-3. However, the present invention is not limited thereto, and one of the two exhaust units 470-5 and 470-6 may not be provided.

A deposition method of using the vapor deposition apparatus 400, in the current embodiment, is briefly described. As a specific example, a method of forming AlxOy on the substrate by using the vapor deposition apparatus 400 is described.

When the substrate S, which is a deposition target, corresponds to the second region 450-1 of the vapor deposition apparatus 400, the second region 450-1 may inject a second raw material, for example, a gas which contains aluminum (Al), such as trimethyl aluminum (TMA) in a gas state, in a direction of the substrate S. Thus, an absorption layer, which contains Al, is formed on an upper surface of the substrate S. Specifically, a chemical absorption layer and a physical absorption layer are formed on the upper surface of the substrate S.

The physical absorption layer which has a weak molecular binding force, among absorption layers formed on the upper surface of the substrate S, is separated from the substrate S by using a purge gas, which is injected by the purge unit 460-1 or the purge unit 460-2. Then, the physical absorption layer is effectively removed from the substrate S by pumping the exhaust units 470-2 and 470-3. Thus, a purity of a deposition layer, to be formed on the substrate S, is eventually improved.

Then, when the substrate S, which is a deposition target, moves along an X direction shown in FIG. 6, that is, a direction of an arrow, and thus corresponds to the first injection unit 442 in the first region 410-1 of the vapor deposition apparatus 400, a first raw material gas flows into the reaction space 403. Specifically, the first raw material gas contains oxygen, for example, water ($H_2O$), oxygen ($O_2$), nitrous oxide ($N_2O$).

A plasma is generated from between the plasma generation unit 411 and the corresponding surface 415 of the reaction space 403. At least a part of an oxygen in the raw material gases, which flows into the reaction space 403, is changed into a radical form.

Ions and electrons, accelerating in the reaction space 403, may be prevented or substantially prevented from colliding with a surface of the plasma generation unit 411 by using the insulating member 420. As a result, generation of particles, which may be generated from a surface of the plasma generation unit 411, is prevented or substantially prevented. For example, an inflow of particles from the surface of the plasma generation unit 411 through the inserting member 430 is completely prevented or substantially prevented. Additionally, the insulating member 420 and the plasma generation unit 411 are separated from each other, so as to effectively prevent, substantially prevent, or reduce heat, generated from the plasma generation unit 411, from being transmitted to the insulating member 420. Thus, damage on the insulating member 420 is prevented or substantially prevented, and for example, generation of particles, which may be generated from a surface of the insulating member 400 due to an increase in phonon in the insulating member 420, is prevented or substantially prevented.

Thus, a high-purity material in a radical form may exist in the reaction space 403. Such a material in a radical form reaches a surface of the substrate S, and thus, a desired deposition layer is formed.

That is, a first raw material gas in the radical form reacts with a chemical absorption layer, formed of a second raw material which is already absorbed in the substrate S, or substitutes a part of the chemical absorption layer. Thus, AlxOy, which is a desired deposition layer, is formed on the substrate S. An excessive amount of the first raw material forms the physical absorption layer, and remains on the substrate S.

A purge gas is injected from the purge unit 460-2 or 460-3 in a direction toward the substrate S. Thus, the physical absorption layer of the first raw material, which remains on the substrate S, is separated from the substrate S and is effectively removed or substantially removed from the substrate S by pumping the exhaust unit 470-4 and 470-5. Therefore, a purity of a deposition layer, to be formed on the substrate S, is eventually improved.

As a result, a deposition layer, which contains the first raw material and the second raw material, is formed on the substrate S. Specifically, a single atomic layer, which contains AlxOy, is formed on the substrate S.

Then, the substrate S sequentially moves to correspond to the second region 450-2 and the first region 410-2. Thus, a deposition layer may be further formed sequentially as desired.

Then, the substrate S and the vapor deposition apparatus 400 may move with respect to each other, and perform a deposition process. That is, as illustrated in FIG. 6, the substrate S may move in an X direction shown in FIG. 6, and thus, a deposition process may be consecutively performed. Conversely, the vapor deposition apparatus 400 may move, and thus, a deposition process may be performed. The present invention is not limited thereto, and a deposition process may also be performed when the substrate S is fixed to the vapor deposition apparatus 400.

The vapor deposition apparatus 400, in the current embodiment, may easily form a high-purity deposition layer by keeping the inside of the reaction space 403 uncontaminated or substantially uncontaminated.

Figure 8:
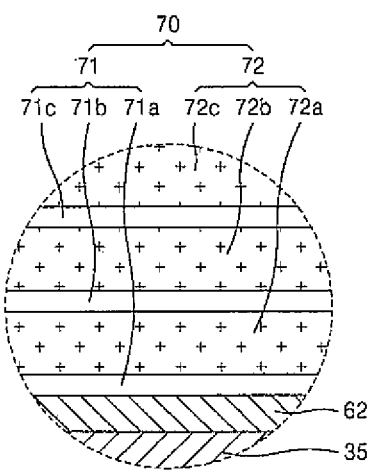
FIG. 8 is an expanded view of a portion F of FIG. 7.

FIG. 7 is a schematic cross-sectional view illustrating an organic light-emitting display apparatus which is manufactured by using a method of manufacturing an organic light-emitting display apparatus, according to an embodiment of the present invention. FIG. 8 is an extended view of a portion F of FIG. 7.

Specifically, FIGS. 7 and 8 illustrate an organic light-emitting display apparatus 10 which is manufactured by using one of the vapor deposition apparatuses 100 through 400, described above.

The organic light-emitting display apparatus 10 is formed on a substrate 30. The substrate 30 may be formed of glass, plastic, or metal.

A buffer layer 31, which contains an insulating material, is formed on the substrate 30, in order to prevent moisture or a foreign material from penetrating into the substrate 30 and to provide a planarization surface on an upper portion of the substrate 30.

A thin-film transistor (TFT) 40, a capacitor 50, an organic light-emitting device 60 are formed on the buffer layer 30. The TFT 40 includes an active layer 41, a gate electrode 42, and source/drain electrodes 43. The organic light-emitting device 60 includes a first electrode 61, a second electrode 62, and an intermediate layer 63.

The capacitor 50 includes a first capacitor electrode 51 and a second capacitor electrode 52.

Specifically, the active layer 41, formed to have a pattern (e.g., a predetermined pattern), is located on the buffer layer 31. The active layer 41 may contain an inorganic semiconductor material such as silicon, an organic semiconductor material, or an oxide semiconductor material. The active layer 41 may be formed by injecting a p-type dopant or an n-type dopant. The first capacitor electrode 51 is formed on the same layer as the active layer 41. The first capacitor electrode 51 may be formed of the same material as the active layer 41.

A gate insulating layer 32 is formed on an upper portion of the active layer 41. The gate electrode 42 is formed on an upper portion of the gate insulating layer 32, to correspond to the active layer 41. An interlayer insulating layer 33 is formed to cover the gate electrode 42. The source/drain electrodes 43 are formed on the interlayer insulating layer 33, so as to contact a predetermined area of the active layer 41. The second capacitor electrode 52 is formed on the same layer as the source/drain electrodes 43. The second capacitor electrode 52 may be formed of the same material as the source/drain electrodes 43.

A passivation layer 34 is formed to cover the source/drain electrodes 43. An additional insulating layer may be further formed on the passivation layer 34 so as to planarize the TFT 40.

The first electrode 61 is formed on the passivation layer 34. The first electrode 61 is formed to be electrically coupled to either of the source/drain electrodes 43. Additionally, a pixel-defining layer 35 is formed to cover the first electrode 61. A predetermined opening 64 is formed on the pixel-defining layer 35. Then, the intermediate layer 63, which includes an organic light-emitting layer, is formed within an area defined by the opening 64. The second electrode 62 is formed on the intermediate layer 63.

An encapsulation layer 70 is formed on the second electrode 62. The encapsulation layer 70 may contain an organic or inorganic material. The encapsulation layer 70 may also be a structure in which an organic material and an inorganic material are alternately stacked.

The encapsulation layer 70 may be formed by using one of the vapor deposition apparatuses described herein. That is, a desired layer may be formed on the substrate 30, on which the second electrode 62 is formed, by passing through the vapor deposition apparatus described herein.

For example, the encapsulation layer 70 may include an inorganic layer 71 and an organic layer 72. The inorganic layer 71 includes a plurality of layers 71a through 71c. The organic layer 72 includes a plurality of layers 72a through 72c. The plurality of layers 71a through 71c, included in the inorganic layer 71, may be formed by using the vapor deposition apparatus according to the present invention.

However, the present invention is not limited thereto. That is, the buffer layer 31, the gate insulating layer 32, the interlayer insulating layer 33, the passivation layer 34, the pixel-defining layer 35, and other insulating layers may be formed by using the vapor deposition apparatus in the present invention.

Additionally, the active layer 41, the gate electrode 42, the source/drain electrodes 43, the first electrode 61, the intermediate layer 63, the second electrode 62, and other various thin films may also be formed by using the vapor deposition apparatus in the present invention.

As describe above, when the vapor deposition apparatus in the present invention is used, characteristics of a deposition layer, formed on the organic light-emitting display apparatus 10, may be improved. Resultantly, electrical and image quality characteristics of the organic light-emitting display apparatus 10 may also be improved.

A vapor deposition apparatus, a deposition method of using the same, and a method of manufacturing an organic light-emitting display apparatus may efficiently prevent or substantially prevent contamination of a deposition space, and improve characteristics of a deposition layer.

While the present invention has been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. A vapor deposition apparatus for forming a deposition layer on a substrate, the vapor deposition apparatus comprising:
   a plasma generator configured to change at least a portion of a first raw material gas into a radical form, the plasma generator comprising at least one cylindrical terminal unit protruding from at least one end of the plasma generator, the at least one cylindrical terminal unit having a diameter less than an outer diameter of the plasma generator;
   a corresponding surface corresponding to the plasma generator to have a reaction space between the plasma generator and the corresponding surface;
   an insulating member separated from, and surrounding the plasma generator such that a space is formed between the plasma generator and the insulating member;
   a first injector coupled to the reaction space and configured to inject a deposition raw material onto the substrate; and
   a connection unit having a narrower width than the first injector located between the reaction space and the first injector,
   wherein the plasma generator does not contact the insulating member entirely, and the plasma generator and the insulating member each have a length in a first direction,
   wherein a first insertion member and a second insertion member are disposed with each other along the first direction and between the plasma generator and the insulating member, and the first insertion member and the second insertion member are spaced along the first direction, and
   wherein the space is enclosed by the plasma generator, the insulating member, the first insertion member, and the second insertion member.

2. The vapor deposition apparatus of claim 1, wherein the insulating member is separated from the plasma generator by the first insertion member and the second insertion member located between the plasma generator and the insulating member.

3. The vapor deposition apparatus of claim 2, wherein the space between the plasma generator and the insulating member is substantially sealed by the first insertion member and the second insertion member.

4. The vapor deposition apparatus of claim 3, wherein the first insertion member is adjacent to one end of the plasma generator, and the second insertion member is adjacent to an opposing end of the plasma generator, and
   wherein a space between the first insertion member and the second insertion member, between the plasma generator and the insulating member, is substantially sealed by the first insertion member and the second insertion member.

5. The vapor deposition apparatus of claim 2, wherein the first insertion member and the second insertion member has elasticity.

6. The vapor deposition apparatus of claim 2, wherein the first insertion member and the second insertion member is an O-ring.

7. The vapor deposition apparatus of claim 1, wherein the plasma generator is an electrode.

8. The vapor deposition apparatus of claim 1, wherein the plasma generator has a generally column shape.

9. The vapor deposition apparatus of claim 1, wherein the insulating member has a form of a hollow column.

10. The vapor deposition apparatus of claim 1, wherein the insulating member comprises a quartz or ceramic material.

11. The vapor deposition apparatus of claim 1, wherein the insulating member surrounds an entire external surface of the plasma generator.

12. The vapor deposition apparatus of claim 1, wherein the deposition raw material comprises a radical form of the first raw material gas.

13. The vapor deposition apparatus of claim 12, further comprising a second injector adjacent to the first injector, the second injector being separated from the first injector.

14. The vapor deposition apparatus of claim 13, wherein the second injector is configured to inject a second raw material or a purge gas toward a direction of the substrate for forming the deposition layer.

15. The vapor deposition apparatus of claim 12, further comprising a second injector and a third injector adjacent to and separated from the first injector, and respectively on opposing sides of the first injector.

16. The vapor deposition apparatus of claim 15, wherein the second injector and the third injector are respectively configured to inject one selected from the group consisting of a purge gas, a second raw material, and a third raw material, in a direction toward the substrate.

17. The vapor deposition apparatus of claim 15, further comprising a plurality of exhausts adjacent to each of the first injector, the second injector, and the third injector.

18. The vapor deposition apparatus of claim 17, wherein the plurality of exhausts comprise a first exhaust between the first injector and the second injector, and a second exhaust between the first injector and the third injector.

19. The vapor deposition apparatus of claim 1, wherein the substrate and the vapor deposition apparatus are configured to move with respect to each other.

20. A vapor deposition apparatus for forming a deposition layer on a substrate, the vapor deposition apparatus comprising:
 a plurality of first regions, a plurality of second regions, and a plurality of purge units,
 wherein each of the plurality of first regions comprises:
  a plasma generator configured to change at least a portion of a first raw material gas into a radical form, the plasma generator comprising at least one cylindrical terminal unit protruding from at least one end of the plasma generator, the at least one cylindrical terminal unit having a diameter less than an outer diameter of the plasma generator;
  a corresponding surface corresponding to the plasma generator to have a reaction space between the plasma generator and the corresponding surface;
  an insulating member separated from, and surrounding the plasma generator such that a space is formed between the plasma generator and the insulating member;
  a first injector coupled to the reaction space and configured to inject a deposition raw material onto the substrate; and
  a connection unit having a narrower width than the first injector located between the reaction space and the first injector,
 wherein each of the plurality of second regions is configured to inject a second raw material in a direction toward the substrate; and
 wherein the purge units are configured to inject a purge gas in the direction toward the substrate,
 wherein the plasma generator does not contact the insulating member entirely, and the plasma generator and the insulating member each have a length in a first direction,
 and wherein a first insertion member and a second insertion member are disposed with each other along the first direction and between the plasma generator and the insulating member, and the first insertion member and the second insertion member are spaced along the first direction,
 and wherein the space is enclosed by the plasma generator, the insulating member, the first insertion member, and the second insertion member.

21. The vapor deposition apparatus of claim 20, wherein each purge unit, from among the plurality of purge units, is between a first region and a second region.

22. The vapor deposition apparatus of claim 20, further comprising a plurality of exhaust units adjacent to the first regions, the second regions, and the purge units.

* * * * *